United States Patent
Moon et al.

(10) Patent No.: US 10,295,630 B2
(45) Date of Patent: May 21, 2019

(54) GRADIENT COIL WITH VARIABLE DIMENSION

(71) Applicant: General Electric Company, Schenectady, NY (US)

(72) Inventors: Sung Man Moon, Brookfield, WI (US); Shahed Ashraf, Florence, SC (US); William Louis Einziger, Florence, SC (US); Derek Allan Seeber, Florence, SC (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 747 days.

(21) Appl. No.: 14/839,444

(22) Filed: Aug. 28, 2015

(65) Prior Publication Data

US 2017/0059675 A1 Mar. 2, 2017

(51) Int. Cl.
*G01R 33/385* (2006.01)

(52) U.S. Cl.
CPC ..... *G01R 33/3858* (2013.01); *G01R 33/3856* (2013.01)

(58) Field of Classification Search
CPC .............. G01R 33/385; G01R 33/3856; G01R 33/3858
USPC ................................................ 324/300–322
See application file for complete search history.

(56) References Cited

U.S. PATENT DOCUMENTS

| | | | | |
|---|---|---|---|---|
| 4,617,516 A | * | 10/1986 | Schenck | G01R 33/385 324/307 |
| 5,124,652 A | * | 6/1992 | Aubert | G01R 33/385 324/318 |
| 5,424,643 A | * | 6/1995 | Morich | G01R 33/34 324/318 |
| 6,456,076 B1 | | 9/2002 | Joseph | |
| 7,372,275 B2 | * | 5/2008 | Feenan | G01R 33/385 324/318 |
| 8,188,737 B2 | * | 5/2012 | Saha | G01R 33/34076 324/307 |
| 2004/0150402 A1 | * | 8/2004 | Sakakura | G01R 33/385 324/318 |
| 2005/0030028 A1 | * | 2/2005 | Clarke | G01R 33/3403 324/318 |
| 2010/0321019 A1 | * | 12/2010 | Imamura | G01R 33/385 324/318 |
| 2014/0184372 A1 | * | 7/2014 | Mathieu | G01R 33/3856 336/60 |
| 2014/0302258 A1 | * | 10/2014 | Mathieu | G01R 33/3858 427/596 |
| 2015/0137814 A1 | * | 5/2015 | Terada | G01R 33/022 324/322 |
| 2017/0219668 A1 | * | 8/2017 | Thiagarajan | G01R 33/3858 |

* cited by examiner

*Primary Examiner* — Jay Patidar

(57) ABSTRACT

Methods and systems are provided for a variable wire dimension gradient coil. In one example, a gradient coil includes a length of coiled wire, the wire comprising a first segment having a first width and a second segment having a second width, the second width smaller than the first width.

6 Claims, 4 Drawing Sheets

GRADIENT COIL WITH VARIABLE DIMENSION

FIELD

Embodiments of the subject matter disclosed herein relate to non-invasive diagnostic imaging, and more particularly, to a gradient coil for magnetic resonance imaging systems.

BACKGROUND

Magnetic resonance imaging (MRI) is a medical imaging modality that can create images of the inside of a human body without using x-rays or other ionizing radiation. MRI uses a powerful magnet to create a strong, uniform, static magnetic field. When a human body, or part of a human body, is placed in the main magnetic field, the nuclear spins that are associated with the hydrogen nuclei in tissue water or fat become polarized. This means that the magnetic moments that are associated with these spins become preferentially aligned along the direction of the main magnetic field, resulting in a small net tissue magnetization along that axis. An MRI system also comprises components called gradient coils that produce smaller amplitude, spatially varying magnetic fields when a current is applied to them. Typically, gradient coils are designed to produce a magnetic field component that is aligned along the z-axis and that varies linearly in amplitude with position along one of the x, y, or z-axes. The effect of a gradient coil is to create a small ramp on the magnetic field strength and, in turn, on the resonant frequency of the nuclear spins along a single axis. Three gradient coils with orthogonal axes are used to "spatially encode" the MRI signal by creating a signature resonance frequency at each location in the body. Radio frequency (RF) coils are used to create pulses of RF energy at or near the resonance frequency of the hydrogen nuclei. The RF coils are used to add energy to the nuclear spins in a controlled fashion. As the nuclear spins then relax back to their rest energy state, they give up energy in the form of an RF signal. This signal is detected by the MRI system and is transformed into an image using a computer and know reconstruction algorithms.

The design of a gradient coil typically involves many compromises. For example, it is desirable to have a gradient coil that produces a highly linear magnetic field while using the smallest amount of current from a power supply. Additionally, gradient coils may necessitate cooling in order to avoid patient discomfort due to heat generation in the gradient coils. In some examples, gradient coils may be comprised of hollow wire in order to provide a conduit within the gradient coils for carrying coolant. To increase the strength of the magnetic field, it may be desirable to include a higher number of turns within a gradient coil. However, simply utilizing smaller diameter wire in the gradient coil increases resistance of the gradient coil and places additional load on the gradient coil current driver. Further, the inclusion of hollow gradient coils increases the diameter of the wire comprising the gradient coil and constrains the number of turns the coil is capable of including.

BRIEF DESCRIPTION

In one embodiment, a gradient coil comprises a length of coiled wire, the wire comprising a first segment having a first width and a second segment having a second width, the second width smaller than the first width. In this way, by providing variable wire width within the same gradient coil, the turn density of the coil can be increased, at least in certain regions of the gradient coil, without substantially increasing the resistance of the gradient coil. Further, in some examples, the gradient coil may comprise a hollow channel present in both the first and second segments to provide coolant flow to cool the gradient coil, and the hollow channel may be continuous along an entirety of the gradient coil. The hollow channel may be of relatively uniform width and/or cross-section area, or it may decrease in width and/or cross-sectional area in the second segment of wire relative to the first.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below.

DETAILED DESCRIPTION

Figure 4:
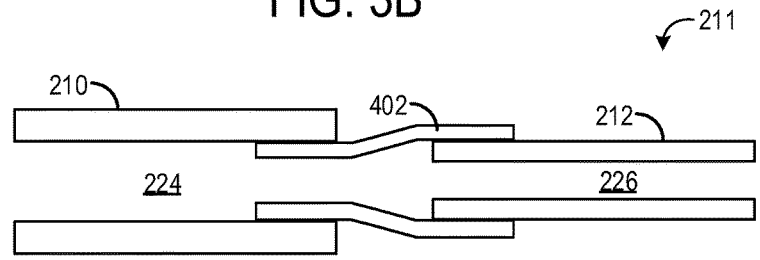
FIG. 4 shows a partial cross-section view of an example gradient coil fitting coupling a first segment of wire to a second segment of wire.
Figure 5:
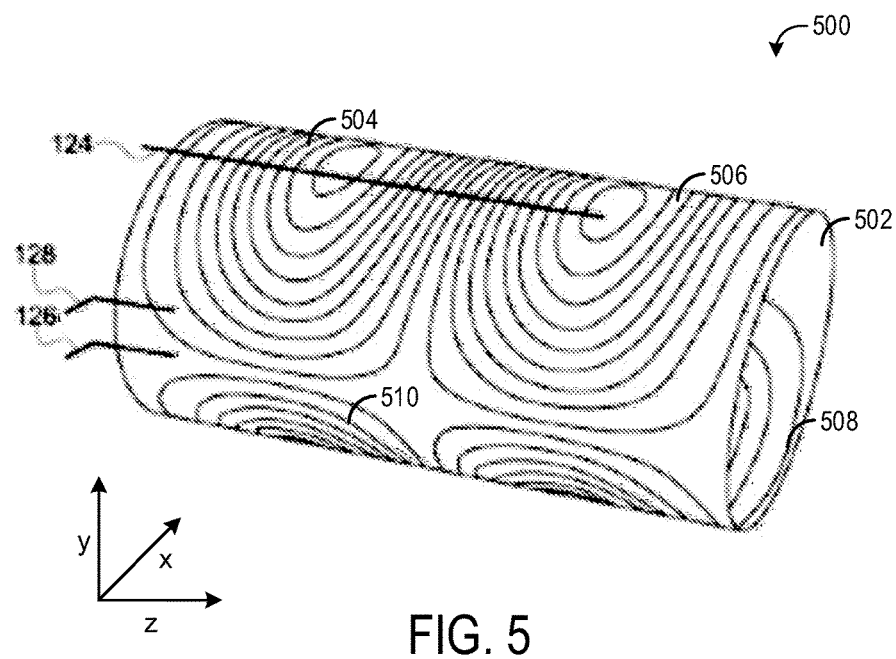
FIG. 5 shows a schematic illustration of an exemplary gradient board supporting a plurality of y-gradient coils according to an embodiment of the invention.
Figure 7:
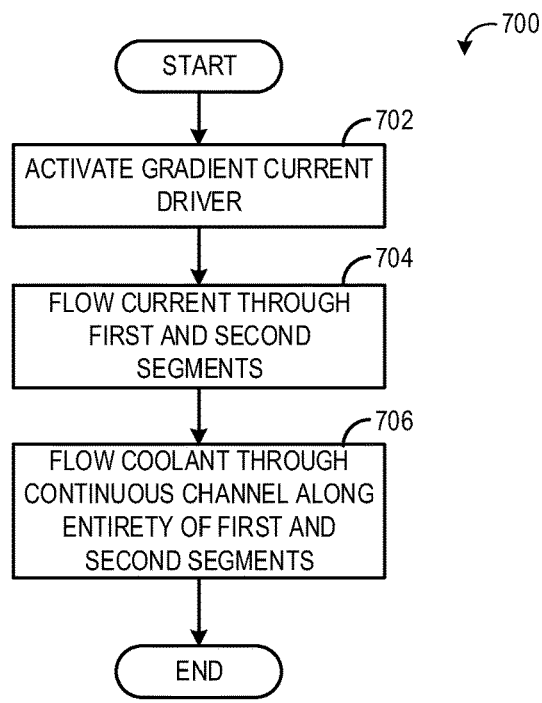
FIG. 7 shows a high-level flow chart illustrating an example method for a gradient coil.
Figure 8:
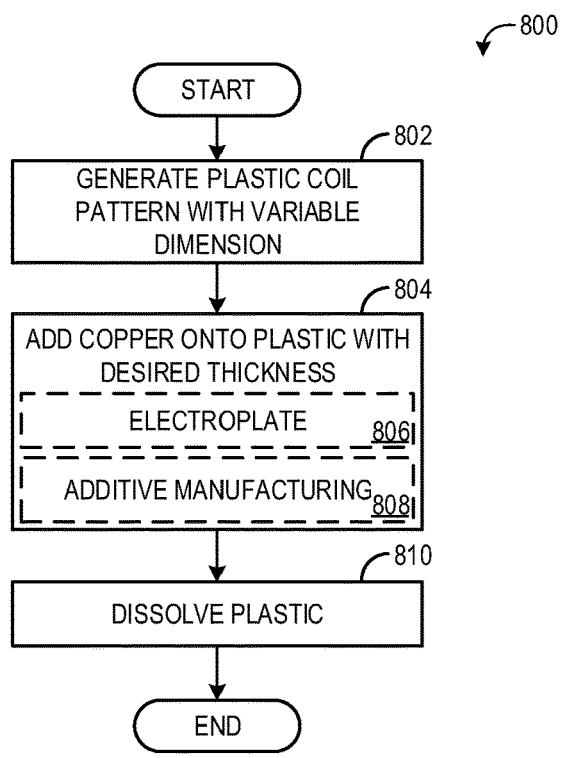
FIG. 8 shows a high-level flow chart illustrating an example method for manufacturing a gradient coil.

The following description relates to various embodiments of medical imaging systems. In particular, methods and systems are provided for a gradient coil having increased turn density while maintaining sufficient cooling and minimizing increased current requirements. An example of a magnetic resonance imaging (MRI) system that may be used to acquire images is provided in FIG. 1. The MRI system of FIG. 1 may include one or more gradient coils arranged in cylindrical fashion to define an imaging volume, as illustrated in FIGS. 2 and 5. Example gradient coils having variable dimensions are illustrated in FIGS. 3A, 3B, 4, and 6. A method for using a gradient coil during imaging of an imaging volume is shown in FIG. 7, while a method for manufacturing a gradient coil is shown in FIG. 8.

Figure 1:
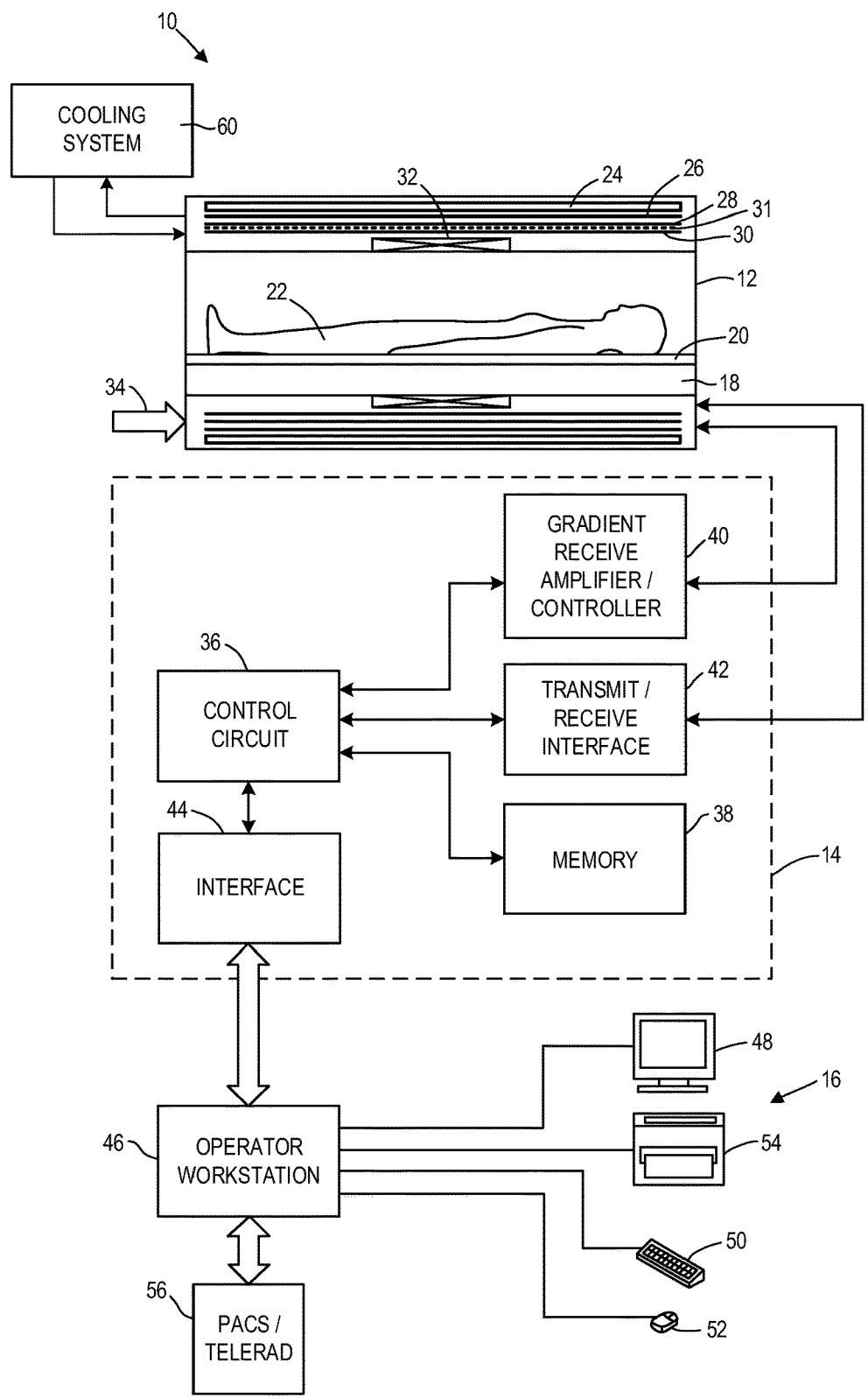
FIG. 1 shows a diagrammatical representation of an MRI system according to an embodiment of the invention.
Figure 2:
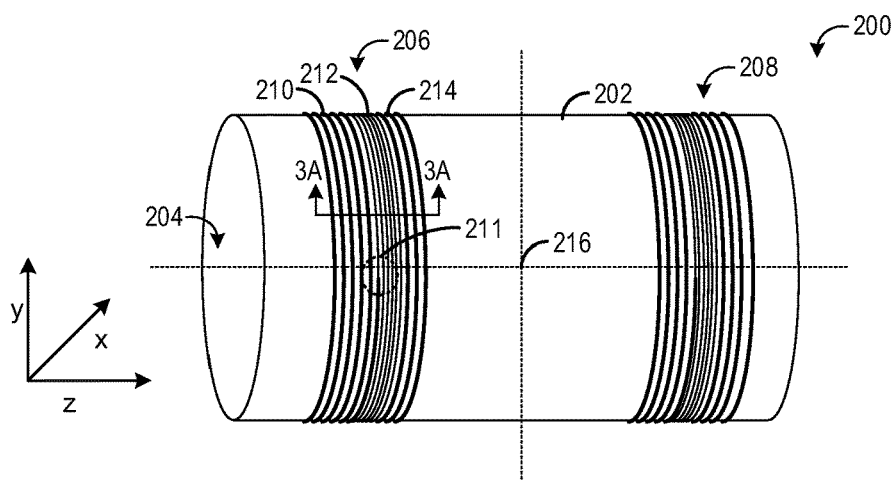
FIG. 2 shows a schematic illustration of an exemplary gradient board supporting a plurality of z-gradient coils according to an embodiment of the invention.

Turning now to the drawings, and referring first to FIG. 1, a magnetic resonance imaging (MRI) system 10 is illustrated diagrammatically as including a scanner 12, scanner controller circuitry 14, and system control circuitry 16. While the MRI system 10 may include any suitable MRI scanner or detector, in the illustrated embodiment the system includes a full body scanner comprising an imaging volume 18 into which a table 20 may be positioned to place a patient 22 in a desired position for scanning. The scanner 12 may additionally or alternatively be configured to target certain anatomy, such as the head or neck.

The scanner 12 may include a series of associated coils for producing controlled magnetic fields, for generating radio frequency (RF) excitation pulses, and for detecting emissions from gyromagnetic material within the patient in response to such pulses. In the diagrammatical view of FIG. 1, a main magnet 24 is provided for generating a primary magnetic field generally aligned with the imaging volume 18. A series of gradient coils 26, 28, and 30 are grouped in one or more gradient coil assemblies for generating controlled magnetic gradient fields during examination sequences as described more fully below. An RF coil 32 is provided for generating RF pulses for exciting the gyromagnetic material. Power may be supplied to the scanner 12 in any appropriate manner, as indicated generally at reference number 34. In the embodiment illustrated in FIG. 1, the RF coil 32 may also serve as a receiving coil. Thus, the RF coil 32 may be coupled with driving and receiving circuitry in passive and active modes for receiving emissions from the gyromagnetic material and for applying RF excitation pulses, respectively. Alternatively, various configurations of receiving coils may be provided separate from RF coil 32. Such coils may include structures specially adapted for target anatomies, such as head coil assemblies, and so forth. Moreover, receiving coils may be provided in any suitable physical configuration, including phased array coils, and so forth.

In a present configuration, the gradient coils 26, 28, and 30 may be formed of conductive wires, bars, or plates which are wound or cut to form a coil structure which generates a gradient field upon application of control pulses. The placement of the coils within the gradient coil assembly may be done in several different orders and with varying configurations, and the scanner 12 may further include complementary gradient coils (in the manner described below) to shield the gradient coils 26, 28, and 30. Generally, a z-gradient coil 26 may be positioned at an outermost location, and is formed generally as a solenoid-like structure which has relatively little impact on the RF magnetic field. The gradient coils 28 and 30 may be x-axis and y-axis coils respectively.

The gradient coils 26, 28, and 30 of the scanner 12 may be controlled by external circuitry to generate desired fields and pulses, and to read signals from the gyromagnetic material in a controlled manner. When the material, typically bound in tissues of the patient, is subjected to the primary field, individual magnetic moments of the paramagnetic nuclei in the tissue partially align with the field. While a net magnetic moment is produced in the direction of the polarizing field, the randomly oriented components of the moment in a perpendicular plane generally cancel one another. During an examination sequence, the RF coil 32 may generate an RF pulse at or near the Larmor frequency of the material of interest, resulting in a rotation of the net aligned moment to produce a net transverse magnetic moment. This transverse magnetic moment precesses around the main magnetic field direction, emitting RF signals that are detected by the scanner 12 and processed for reconstruction of the desired image.

The gradient coils 26, 28, and 30 may serve to generate precisely controlled magnetic fields, the strength of which vary over a predefined field of view, typically with positive and negative polarity. When each gradient coil 26, 28, or 30 is energized with known electric current, the resulting magnetic field gradient is superimposed over the primary field and produces a desirably linear variation in the axial component of the magnetic field strength across the field of view. The field may vary linearly in one direction, but may be homogeneous in the other two. The three gradient coils 26, 28, and 30 have mutually orthogonal axes for the direction of their variation, enabling a linear field gradient to be imposed in an arbitrary direction with an appropriate combination of the three gradient coils 26, 28, and 30.

One or more shielding coils, such as shielding coil 31, may be present. The shielding coil 31 comprises turns of a conductive material configured to carry current in an opposite direction as a respective gradient coil, such as coil 30. Like the primary coil, the shielding coil includes a shielding x-coil, a shielding y-coil, and a shielding z-coil. The shielding coil 31 is configured to create a magnetic field that is substantially the opposite of the field created by the primary coil for regions outside of the shielding coil 31. For example, the shielding coil 31 is designed to minimize the stray fields from the primary coil that might otherwise induce eddy currents in other conducting structures, such as a cryostat (not shown). It is important to minimize the production of eddy currents in order to prevent the generation of time-varying magnetic fields that would otherwise negatively impact the performance of the MRI system.

The pulsed gradient fields may perform various functions integral to the imaging process. Some of these functions are slice selection, frequency encoding, and phase encoding. These functions can be applied along the x-, y-, and x-axes of the original coordinate system or along other axes determined by combinations of pulsed current applied to the individual field coils.

The slice select gradient field may determine a slab of tissue or anatomy to be imaged in the patient, and may be applied simultaneously with a frequency selective RF pulse to excite a known volume of spins that may precess at the same frequency. The slice thickness may be determined by the bandwidth of the RF pulse and the gradient strength across the field of view.

The frequency encoding gradient, also known as the readout gradient, is usually applied in a direction perpendicular to the slice select gradient. In general, the frequency encoding gradient is applied before and during the formation of the MR echo signal resulting from the RF excitation. Spins of the gyromagnetic material under the influence of this gradient are frequency encoded according to their spatial position along the gradient field. By Fourier transformation, acquired signals may be analyzed to identify their location in the selected slice by virtue of the frequency encoding.

Finally, the phase encode gradient is generally applied before the readout gradient and after the slice select gradient. Localization of spins in the gyromagnetic material in the phase encode direction is accomplished by sequentially inducing variations in phase of the precessing protons of the material using slightly different gradient amplitudes that are sequentially applied during the data acquisition sequence. The phase encode gradient permits phases differences to be created among the spins of the material in accordance with their position in the phase encode direction.

A great number of variations may be devised for pulse sequences employing the exemplary gradient pulse functions described above, as well as other gradient pulse functions not explicitly described here. Moreover, adaptations in the pulse sequences may be made to appropriately orient the selected slice and the frequency and phase encoding to excite the desired material and to acquire resulting MR signals for processing.

The coils of the scanner 12 are controlled by the scanner control circuitry 14 to generate the desired magnetic field and radio frequency pulses. In the diagrammatical view of FIG. 1, the control circuitry 14 thus includes a control circuit 36 for commanding the pulse sequences employed during the examinations, and for processing received signals. The control circuit 36 may include any suitable programmable logic device, such as a CPU or digital signal processor of a general purpose or application-specific computer. Further, the control circuit 36 may include memory circuitry 38, such as volatile and/or non-volatile memory devices for storing physical and logical axis configuration parameters, examination pulse sequence descriptions, acquired image data, programming routines, and so forth, used during the examination sequences implemented by the scanner 12.

Interface between the control circuit 36 and the coils of the scanner 12 may be managed by amplification and control circuitry 40 and by transmission and receive interface circuitry 42. The amplification and control circuitry 40 includes amplifiers for each gradient field coil 26, 28, and 30 to supply drive current in response to control signals from the control circuit 36. The receive interface circuitry 42 includes additional amplification circuitry for driving the RF coil 32. Moreover, where the RF coil 32 serves both to emit the RF excitation pulses and to receive MR signals, the receive interface circuitry 42 may include a switching device for toggling the RF coil between active or transmitting mode, and passive or receiving mode. A power supply, denoted generally by reference number 34 in FIG. 1, is provided for energizing the primary magnet 24. Finally, the scanner control circuitry 14 includes interface components 44 for exchanging configuration and image data with the system control circuitry 16.

The system control circuitry 16 may include a wide range of devices for facilitating interface between an operator or radiologist and the scanner 12 via the scanner control circuitry 14. In the illustrated embodiment, for example, an operator workstation 46 is provided in the form of a computer workstation employing a general purpose or application-specific computer. The operator workstation 46 also typically includes memory circuitry for storing examination pulse sequence descriptions, examination protocols, user and patient data, image data, both raw and processed, and so forth. The operator workstation 46 may further include various interface and peripheral drivers for receiving and exchanging data with local and remote devices. In the illustrated embodiment, such devices include a monitor 48, a conventional computer keyboard 50, and an alternative input device such as a mouse 52. A printer 54 is provided for generating hard copy output of documents and images reconstructed from the acquired data. In addition, the system 10 may include various local and remote image access and examination control devices, represented generally by reference number 56 in FIG. 1. Such devices may include picture archiving and communications systems (PACS), teleradiology systems (telerad), and the like.

Additionally, MRI system 10 may include a cooling system 60. The cooling system 60 may include one or more heat exchangers or chillers, a coolant pump, and coolant lines to flow coolant to one or more of the gradient coils. As will be described in more detail below, one or more gradient coils may be comprised of hollow wire and coupled to the cooling system such that coolant may flow through the hollow wire in order to provide direct cooling the gradient coil.

FIG. 2 shows a schematic diagram 200 of an example gradient board 202 supporting one or more gradient coils. The gradient board may include a fiberglass reinforced polymer or any other non-conductive durable material. The gradient board may be bent in order to form a substantially cylindrical bore 204 configured to house a subject to be imaged, for example, and hence the bore may also be referred to as the imaging volume. In some examples, the gradient board may be comprised of two or more separate boards joined together. As shown, two gradient coils are mounted to a surface of the gradient board, first gradient coil 206 and second gradient coil 208.

While not shown in FIG. 2, an electrical connector, inlet connector, and/or outlet connector may be present. In regard to the electrical connector, a dielectric spacer may be disposed onto the gradient coils prior to deposition of the electrical conductor to prevent shorting between undesired portions of the coils and to enable a defined flow of current through the coils. Thus, the dielectric spacer electrically isolates the gradient coil from the electrical conductor, except at the points where electrical current is provided to and from the coils. The connectors may be machined to include internal fluid paths, so as to enable the flow of the coolant into the hollow gradient coils, for example.

The gradient board and gradient coils may be oriented as illustrated in FIG. 2 to generate a z-axis gradient, where the magnetic field varies in the z-axis (e.g., along the longitudinal axis of the cylindrical bore created by the gradient board). Thus, the gradient board and coils illustrated in FIG. 2 may be one non-limiting example of how the gradient coil 26 of FIG. 1 may be configured. The z-axis gradient coils may comprise of varying magnetic field in the z-axis (e.g., along a length of the imaging volume). A z-axis gradient may be comprised of a gradient board and multiple gradient coils that are configured as Helmholtz coils as opposed to the double-saddle coil (also referred to as Golay coils) configuration illustrated in FIG. 5 and described in more detail below. In an MRI system, such as the system illustrated in FIG. 1, the gradient board 202 of FIG. 2 may be a radial outer-most board, surrounding a second board comprising the x-axis gradient and a third board comprising the y-axis gradient, with additional shielding and/or RF coils disposed intermediate thereto.

The z-axis gradient coils illustrated in FIG. 2 are each comprised of a length of wire wound or otherwise shaped into a helical coil. The wire may be comprised of a suitable material capable of carrying current, such as copper, aluminum, their respective alloys, or any other suitable conductive material. Further, one or both of the first and second gradient coils may coated in enamel or other suitable material.

The gradient coils 206 and 208 may each be comprised of wire having variable dimension (e.g., width) in order to allow for higher turn density in at least one segment of the gradient coil. With reference to gradient coil 206, the gradient coil comprises a first segment of wire 210, a second segment of wire 212, and a third segment of wire 214. The first segment is coupled to a first end of the second segment, as shown in coupling region 211, while the third segment is coupled to a second end of the second segment, such that the second segment is disposed intermediate the first and third segments. However, other configurations are possible, such as only the first segment coupled to the second segment. The segments of wire may be coupled via a suitable mechanism, such as via copper fittings. Additional detail regarding the coupling of the segments of wire will be presented below with respect to FIG. 4.

The second segment of wire may have a smaller width than a width of the first segment and a width of the third segment. Accordingly, the gradient coil may be comprised of a higher number of turns in the region of the second segment of wire relative to the regions of the first and third segments. The second segment of wire may be positioned in the gradient coil at a location where the highest current density is desired. In one example, the second segment may be positioned such that it is within a threshold distance of the isocenter 216 of the MRI system. The isocenter may be the central point of the magnetic field and may be positioned where the x, y, and z axes intersect.

In some examples, each segment of wire within the gradient coils 206, 208 may include a hollow channel or conduit configured to carry coolant. The hollow channel may be continuous along an entire length of the gradient coil. In one example, the relative dimensions of the hollow channel may be different in the second segment relative to the first and/or third segment. For example, the width of the hollow channel within the second segment may be smaller than the width of the hollow channel within the first segment and the third segment. However, reducing the dimensions of the hollow channel in the second segment may present a disturbance to coolant flow (e.g., a narrower width of the channel may reduce overall coolant flow rate), and thus it may be desirable to maintain the hollow channel at the same relative dimensions throughout an entirety of the gradient coil. For example, the hollow channel may have the same width and/or height in each segment of wire. In another example, the width of the hollow channel may be narrower in the second segment of wire relative to the first and/or third, but the height of the hollow channel may be increased to maintain a relatively constant cross-sectional area of the hollow channel.

Accordingly, when the overall width of the wire in the second segment of wire is reduced relative to the first and/or third segment, the width of the hollow channel may also be reduced. However, in some examples the width of the hollow channel may remain equal to the width of the hollow channel in the first and/or third segments. In examples where the overall width of the wire in the second segment is reduced by a larger amount than the width of the hollow channel is reduced, the thickness of the wire itself may be less than the thickness of the wire of the first and/or third segments.

As explained above, the second segment of wire may be disposed intermediate the first segment and the third segment. By placing the second segment in between the first and third segments (which may be wider in width than the second segment), any restrictions introduced into the coolant flow through the hollow channel within the second segment may be at least partially relieved by the increased coolant flow capabilities of the third segment relative to the second segment. In some examples, the first and third segments may have substantially similar lengths (e.g., within 5% of each other) and thus the second segment may be positioned in a central region of the gradient coil with respect to an axial direction of the coil (e.g., the longitudinal axis of the imaging volume).

Figure 3A:
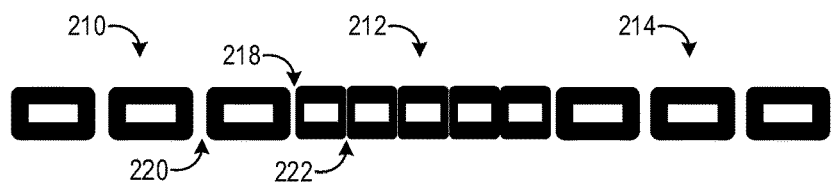
FIGS. 3A and 3B show a partial cross-section view of an example gradient coil.

FIG. 3A schematically illustrates a partial cross-section view of the gradient coil 206 taken along the lines 3A-3A. As shown, the gradient coil includes the first segment of wire 210, second segment of wire 212, and third segment of wire 214. Because of the narrower width of the wire in the second segment, the turn density within the coil where the second segment is positioned is higher than the turn density in the coil comprising the first segment and the second segment. For example, the second segment of wire may be wound into five turns relative to the three turns of the first segment and three turns of the second segment. As a result, the spacing 222 between the turns of the second segment of wire is smaller than the spacing 220 between the turns of the first segment of wire. Also shown in FIG. 3A is the spacing 218 of a turn between the first segment of wire and the second segment of wire, which may be equal to the spacing 222, or may be larger.

Figure 3B:
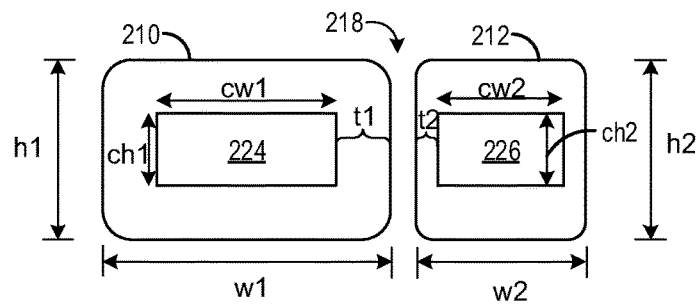

FIG. 3B illustrates an enlarged view of the cross-section of the first segment of wire 210 and the second segment of wire 212. Referring first to the first segment of wire, it has a height, h1, and a width, w1. The height h1 and width w1 may comprise the height and width of the overall wire, including the hollow channel 224. In other words, the height includes the distance from a bottom outer surface of the wire to a top outer surface of the wire, while the width includes the distance from a right outer surface of the wire to a left outer surface of the wire. In one example, the width w1 may be in a range of 8-12 mm while the height h1 may be in a range of 4-8 mm. For example, the wire may have a w1×h1 dimension of 12×8 mm. In another example, the wire may have a w1×h1 dimension of 10×6 mm. In further examples, the wire may have a w1×h1 dimension of 9×6 mm, 9×8 mm, 10×8 mm, 8.5×6 mm, or other suitable dimension.

The first segment includes a hollow channel 224 having a channel height ch1 and a channel width cw1. The hollow channel dimensions may be based on desired flow rate of coolant through the first segment, for example. In one example, the dimensions of the hollow channel 224 may be proportional to the dimensions of the overall wire. In another example, the wire may have a constant thickness around the entirety of the hollow channel. For example, the wire may have a thickness t1 that is 1.5 mm above, below, and to the sides of the hollow channel. In examples where the wire has a dimension of 10×6 (w×h), the hollow channel would comprise a cw1 of 8.5 mm and a ch1 of 3.5 mm.

Referring next to the second segment of wire 212, it has a height, h2, and a width, w2. The height h2 and width w2 may comprise the height and width of the overall wire, including the hollow channel 226. In other words, the height includes the distance from a bottom outer surface of the wire to a top outer surface of the wire, while the width includes the distance from a right outer surface of the wire to a left outer surface of the wire. The width w2 may be narrower than the width w1 of the first segment. The width w2 may be selected based on a desired turn density, resistance of the wire, and desired coolant flow rate and/or hollow channel 226 dimensions. In one example, the width w2 may be two-thirds the width w1 of the first segment of wire. In another example, the width w2 may be half the width w1 of the first segment of wire.

The second segment includes a hollow channel 226 having a channel height ch2 and a channel width cw2. The hollow channel dimensions may be based on desired flow rate of coolant through the second segment, for example. In one example, the dimensions of the hollow channel 226 may be proportional to the dimensions of the overall wire. In another example, the wire may have a constant thickness around the entirety of the hollow channel. In a further example, the hollow channel 226 may have similar dimensions to the hollow channel 224 to maintain a constant coolant flow rate. In a still further example, the hollow channel may have a height ch2 that is equal to the height ch1 of the hollow channel of the first segment and have a width cw2 that is narrower than the width ch1 of the hollow channel of the first segment. The second segment has a wire thickness t2 between a side outer surface (e.g., left or right outer surface) and a side surface of the hollow channel that is narrower than the thickness t1 of the first segment of wire.

Thus, the second segment of wire 212 has a narrower width w2 than the width w1 of the first segment of wire. This narrower width may result from a decreased thickness of wire in the second segment (at least along the width of the wire) relative to the first segment of wire, a decreased width of the hollow channel in the second segment relative to the hollow channel in the first segment, or a combination of both.

As explained above, the third segment of wire is also wider than the second segment of wire. Thus, in some examples, the third segment of wire may have similar dimensions as the first segment of wire, including the same hollow channel dimensions.

The gradient coil 206 includes the first segment of wire coupled to the second segment of wire, and also includes the second segment of wire coupled to the third segment of wire. FIG. 4 illustrates a coupling mechanism between the first segment of wire 210 and the second segment of wire 212. Specifically, FIG. 4 shows a partial cross-section view along the length of the gradient coil 206 at the region 211 where the first segment of wire 210 joins the second segment of wire 212. A fitting 402 couples the first segment to the second segment. The fitting may be comprised of a suitable electrically-conductive material, such as copper. As shown, the fitting 402 includes a first end positioned interior the first segment (within the hollow channel 224) and a second end positioned exterior the second segment. By being positioned inside the first segment but outside the second segment, the fitting may provide a liquid-tight, electrically conductive seal between the two segments of wire without creating additional coolant flow restrictions. However, other configurations are possible, such as the fitting being interior both the first and second segments, or the fitting being exterior both the first and second segments. Further, while the fitting 402 is shown as extending between a gap between the first segment and the second segment, it is to be understood that in some examples, the ends of the wire segments may be in contact or near contact. To fix the fitting to the wire segments, the fitting may be brazed or welded to the first segment and the second segment.

FIG. 5 shows a schematic diagram 500 of an example gradient board 502 supporting one or more gradient coils. The gradient board may include a fiberglass reinforced polymer or any other non-conductive durable material. The gradient board may be bent in order to form a substantially cylindrical bore. In some examples, the gradient board may be comprised of two or more separate boards joined together. As shown, four gradient coils are mounted to a surface of the gradient board, first gradient coil 504, second gradient coil 506, third gradient coil 508, and fourth gradient coil 510.

Also illustrated in FIG. 5 is an electrical connector 124, inlet connector 126 and outlet connector 128. In regard to the electrical connector 124, a dielectric spacer may be disposed onto the gradient coils prior to deposition of the electrical conductor 124 to prevent shorting between undesired portions of the coils and to enable a defined flow of current through the coils. Thus, the dielectric spacer electrically isolates the gradient coil from the electrical conductor 124, except at the points where electrical current is provided to and from the coils. The connectors 126 and 128 may be machined to include internal fluid paths, so as to enable the flow of the coolant into the hollow gradient coils, for example.

The gradient board and gradient coils may be oriented as illustrated in FIG. 5 to generate a y-axis gradient, where the magnetic field varies in the y-axis (e.g., top to bottom). Thus, the gradient board and coils illustrated in FIG. 5 may be one non-limiting example of how the gradient coil 30 of FIG. 1 may be configured. To generate an x-axis gradient, such as the gradient coil 28 of FIG. 1, where the magnetic field varies in x-axis (e.g., left to right), the gradient board and gradient coils may be rotated 90°.

Figure 6:
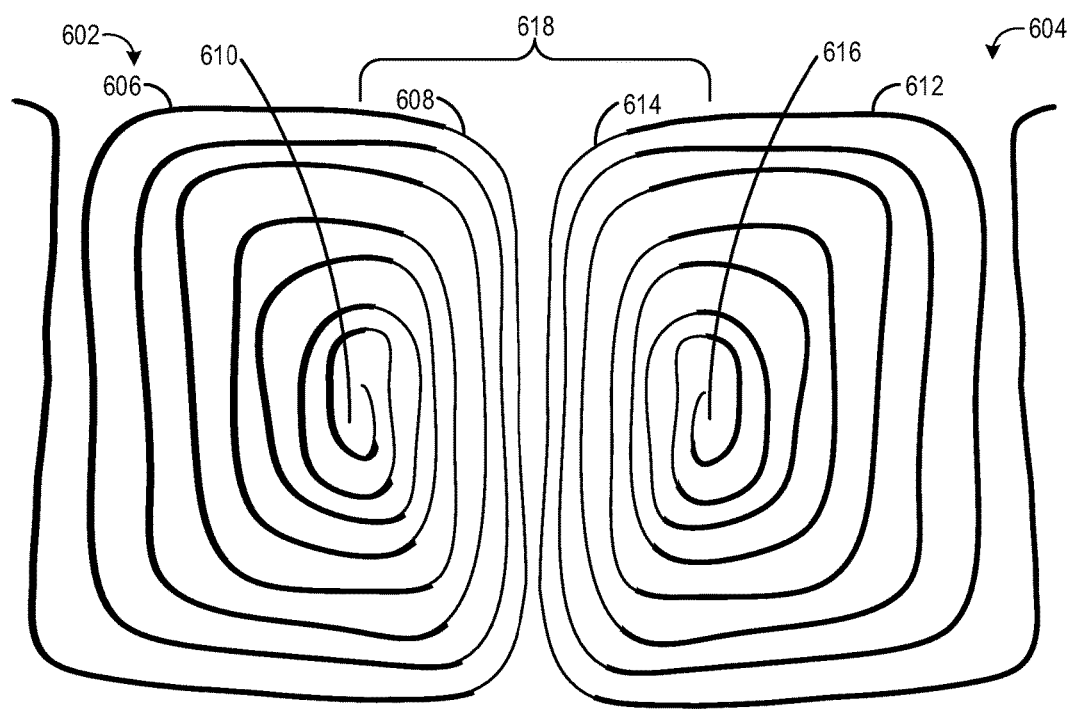
FIG. 6 shows a schematic illustration of example gradient coils according to an embodiment of the invention.

FIG. 6 schematically illustrates two fingerprint-type gradient coils that are arranged adjacent to each other, a first fingerprint gradient coil 602 and second fingerprint gradient coil 604. The coils may be included in an x-axis gradient coil and/or in a y-axis gradient coil, and may be non-limiting examples of the coils illustrated in FIG. 5. Each of the first and second gradient coils 602, 604 may be comprised of a suitable coil material, such as aluminum, copper, their respective alloys, or any other suitable conductive material. Further, one or both of the first and second gradient coils may coated in enamel or other suitable material. The coils may be wound into one or more desired coil geometries, such as curves, bends, varying angles and turning radii.

Similar to the gradient coils described above with respect to FIGS. 2-4, the fingerprint gradient coils may be comprised of wire having variable dimension. However, because the fingerprint gradient coils are wound into a fingerprint pattern of concentric coils, and because the region of desired increased turn density is between the center of the coil and the outer-most turn of the coil, each fingerprint coil may be comprised of a plurality of first segments of wire and a plurality of second segments of wire, where each wire of the plurality of second segments of wire has a narrower width than the first segments of wire. For example, each turn of the first fingerprint gradient coil 602 may be comprised of a first segment of wire 606 and a second segment of wire 608, where the second segment of wire 608 is narrower in width than the first segment of wire 606. Likewise, each turn of the second fingerprint gradient coil 604 may be comprised of a first segment of wire 612 and a second segment of wire 614, where the second segment of wire 614 is narrower in width than the first segment of wire 612. This is repeated for each turn of each coil.

As a result, approximately one-third to half of the gradient coil may include wire having a narrower width than the wire comprising the other half to two-thirds of the gradient coil. The region of desired increased current, and hence region of increased turn density, may be positioned between the eyes of adjacent gradient coils. As shown in FIG. 6, the first fingerprint gradient coil 602 includes a first eye 610 located in the center of the coil, while the second fingerprint gradient coil 604 includes a second eye 616 located in the center of the coil. A region 618 of increased turn density, comprised of respective second segments of wire, lies between the eyes. As shown, the region 618 is substantially diamond-shaped, but other configurations are within the scope of this disclosure.

The first and second segments of wire in the fingerprint gradient coils may be sized and shaped similarly to the first and second segments of wire of the helical gradient coils described above with respect to FIGS. 2-4. As such, each fingerprint gradient coil may include a hollow channel to flow coolant.

FIG. 7 is a flow chart illustrating a method 700 for a gradient coil. In one example, the gradient coil may the gradient coil of FIGS. 2-4 or FIGS. 5-6 comprising a length of hollow wire wound into a helical or fingerprint coil and having variable wire dimensions. At 702, method 700 includes activating a gradient current driver, such as the gradient receive amplifier/controller 40 of FIG. 1. When the current driver is activated, current flows through the wires of the gradient coil, thus generating a magnetic field. Accordingly, at 704, method 700 includes flowing current through the first and second wire segments of the gradient coil.

At 706, method 700 includes flowing coolant through a continuous coolant channel along an entirety of the first and second segments of the gradient coil. As explained previously, the gradient coil may be hollow and coupled to a cooling system. The cooling system is configured to flow coolant through the hollow channel of the gradient coil to cool the gradient coil. The coolant channel created by the hollow channels of the wire segments may be a continuous channel that is not blocked or interrupted, even where the two wire segments are coupled together. In some examples, the coolant may experience a relatively small (e.g., less than 50%) restriction on its flow due to the narrowing of the hollow channel in the second segment of wire and/or due to flowing through the fitting(s) between the wire segments. Method 700 then ends.

FIG. 8 is a flow chart illustrating a method 800 for manufacturing a gradient coil comprised of variable wire dimensions. Method 800 may be used to manufacture the helical gradient coils of FIG. 2 and/or the fingerprint gradient coils of FIG. 5. However, method 800 may be particularly useful for manufacturing the fingerprint gradient coils given the large number of fittings that would otherwise be required if the fingerprint coils were comprised of separate segments of wire coupled via brazed or soldered fittings, as described above with respect to FIG. 4.

At 802, method 800 includes generating a plastic coil pattern with variable dimension. The variable dimension may include the plastic coil thickness or width being variable, e.g., including at least a first segment that is wider than a second segment. In other examples, the thickness or width of the plastic coil may be uniform, but the spacing between turns of the coil may be variable, e.g., there may be a higher turn density (less space) in one region of the pattern than another. In either case, the variable dimension of the plastic pattern may provide for a region of the pattern having a higher turn density than other regions.

At 804, method 800 includes adding copper or other suitable conductive material onto the plastic at a desirable thickness. The copper may be added using a suitable mechanism. In one example, as indicated at 806, the copper may be electroplated onto the plastic. In another example, as indicated at 808, the copper may be added using an additive manufacturing process (e.g., 3D printing). The copper may be added onto the plastic with a uniform thickness along an entirety of the coil, or the thickness of the copper may be variable, e.g., the thickness of the copper may be thinner in the region of higher turn density than in other regions of the coil. At 810, the plastic pattern is dissolved via a suitable mechanism, thus leaving a hollow gradient coil configured for flowing current via the copper plating and for flowing coolant via the hollow channel left by the dissolved plastic. Method 800 then ends.

Thus, the gradient coils described herein provide for helical or fingerprint patterned gradient coils that are hollow to allow flow of coolant and that have variable dimension (e.g., width) in at least one segment of the coil, thus allowing for increased turn density in a portion of the coil. This configuration may increase the gradient strength of the coil without overloading the current driver configured to supply current to the coil, and also allows for coolant flow at a desired flow rate. This is accomplished without increasing the length or radial stack-up of the coil.

The gradient coils described herein may be included as one or more coils of an x-axis gradient, y-axis gradient, or z-axis gradient. In some MRI systems, the x-axis, y-axis, and/or z-axis gradients may be comprised of more than one coil, such as four coils or eight coils. In such examples, any one or more of the coils may be comprised of the variable dimension gradient coil described herein. For example, an x-axis gradient may comprise four inner coils and four outer coils. The four inner coils may be comprised of the variable dimension coils of the disclosure while the four outer coils may be comprised of only solid wire. Other configurations are within the score of the disclosure.

Further, the gradient coils described herein may be configured to be substantially symmetric or asymmetric. For example, one or more of the gradient coils described herein may be wound in a pattern that exhibits asymmetry in one or more planes of the gradient coil. Further, the gradient coils may be arranged within an MRI system to create an asymmetric gradient of magnetic field. For example, two different z-axis coils may be arranged around an imaging volume of the MRI system, where one z-axis coil has a higher turn density than the other z-axis coil.

As explained above, manufacture of the fingerprint gradient coils using variable wire dimension may be more challenging than manufacture of the helical gradient coils using variable wire dimension, due to the relatively high number of changes in wire dimension in the fingerprint configuration. For example, a helical gradient coil may include only three segments of wire coupled via two fittings, while a fingerprint gradient coil may include two segments of wire coupled via two fittings for each turn of the coil. As some fingerprint coil patterns may include over twenty turns, the number of fittings in a fingerprint coil may far exceed the number of fittings in a helical coil. Thus, in some examples, an MRI system, such as the system described in FIG. 1, may include z-axis, helical gradient coils that are comprised variable wire dimension, while the x- and y-axis fingerprint gradient coils are comprised of uniform wire dimension.

A technical effect of the disclosure is increased magnetic field gradient strength without increasing the load placed on the gradient driver.

In one embodiment, a gradient coil comprises a length of coiled wire, the wire comprising a first segment having a first width and a second segment having a second width, the second width smaller than the first width. The wire may comprise a hollow channel. A first portion of the gradient coil comprised of the first segment of wire may have a lower turn density than a second portion of the gradient coil comprised of the second segment of wire. In an example, the gradient coil is a helical coil, and the second portion is positioned in an axially central region of the helical coil. In another example, the gradient coil is a fingerprint coil comprising a plurality of concentric turns, wherein each turn comprises a respective first segment of wire coupled to a respective second segment of wire. The gradient coil may further comprise a third segment of wire having the first width, the second segment of wire disposed intermediate the first and third segments of wire. The first segment may coupled to the second segment via a copper fitting.

An embodiment of a gradient coil for use in a magnetic resonance imaging (MRI) system comprises a first segment of hollow wire having a first overall width; and a second segment of hollow wire coupled to the first segment and having a second, smaller overall width, the first segment and second segment wound into a helical coil. The hollow wire of the first segment and the second segment may define a cooling channel configured to flow coolant, the cooling channel comprising a single, continuous channel along an entirety of the helical coil. A hollow portion of the first segment of hollow wire may have a larger cross-sectional area than a hollow portion of the second segment of hollow wire. The first segment may be coupled to the second segment via a fitting positioned inside the first segment and outside the second segment. The gradient coil may further comprise a third segment of hollow wire coupled to the second segment. In an example, the helical coil comprises only the first segment, second segment, and third segment of wire, a first fitting coupling the first segment to the second segment, and a second fitting coupling the second segment to the third segment. The helical coil may include a lower turn density in a region comprising the first segment relative to a region comprising the second segment.

An embodiment of a Magnetic Resonance Imaging (MRI) system comprises a first gradient coil disposed cylindrically around an imaging volume, the first gradient coil comprising a length of wound wire having a central conduit, the wire of the first gradient coil comprising a first segment having a first overall width and a second segment having a second overall width, the second overall width smaller than the first overall width; and a second gradient coil disposed cylindrically around the imaging volume, the second gradient coil comprising a length of wire having a central conduit, the wire of the second gradient coil having a uniform width along an entirety of the length of the wound wire. The first gradient coil may be a z-gradient coil and the second gradient coil may be an x- or y-gradient coil. A first portion of the z-gradient coil comprised of the first segment of wire may have a lower turn density than a second portion of the z-gradient coil comprised of the second segment of wire. The MRI system may further comprise an isocenter located in the imaging volume, wherein the second portion of the z-gradient is positioned within a threshold distance of the isocenter. The MRI system may further comprise a cooling system coupled to the first gradient coil and the second gradient coil and configured to deliver coolant to each central conduit. The MRI system may further comprise a first gradient driver coupled to the first gradient coil and a second gradient driver coupled to the second gradient coil, each gradient driver configured to deliver pulse sequences to a respective gradient coil.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A gradient coil for use in a magnetic resonance imaging (MRI) system, comprising:
   a length of coiled wire, the wire comprising:
      a first segment including a first hollow channel, the first segment having a first width and the first hollow channel having a first channel width; and
      a second segment including a second hollow channel, the second segment having a second width and the second hollow channel having a second channel width, the second width smaller than the first width and the second channel width smaller than the first channel width.

2. The gradient coil of claim 1, wherein a first portion of the gradient coil comprised of the first segment of wire has a lower turn density than a second portion of the gradient coil comprised of the second segment of wire.

3. The gradient coil of claim 2, wherein the gradient coil is a helical coil, and wherein the second portion is positioned in an axially central region of the helical coil.

4. The gradient coil of claim 1, wherein the gradient coil is a fingerprint coil comprising a plurality of concentric turns, wherein each turn comprises a respective first segment of wire coupled to a respective second segment of wire.

5. The gradient coil of claim 1, further comprising a third segment of wire including a third hollow channel, the third segment having the first width and the third hollow channel having the first channel width, the second segment of wire disposed intermediate the first and third segments of wire.

6. The gradient coil of claim 1, wherein the first segment is coupled to the second segment via a copper fitting.

* * * * *